US 10,248,515 B2

(12) United States Patent
Srinivasan et al.

(10) Patent No.: US 10,248,515 B2
(45) Date of Patent: Apr. 2, 2019

(54) IDENTIFYING A FAILING GROUP OF MEMORY CELLS IN A MULTI-PLANE STORAGE OPERATION

(71) Applicant: Apple Inc., Cupertino, CA (US)

(72) Inventors: Charan Srinivasan, San Jose, CA (US); Eyal Gurgi, Petach Tikva (IL)

(73) Assignee: Apple Inc., Cupertino, CA (US)

( * ) Notice: Subject to any disclaimer, the term of this patent is extended or adjusted under 35 U.S.C. 154(b) by 128 days.

(21) Appl. No.: 15/409,583

(22) Filed: Jan. 19, 2017

(65) Prior Publication Data

US 2018/0203774 A1    Jul. 19, 2018

(51) Int. Cl.
| | |
|---|---|
| G06F 11/20 | (2006.01) |
| G11C 16/16 | (2006.01) |
| G11C 16/10 | (2006.01) |
| G11C 16/34 | (2006.01) |
| G11C 16/26 | (2006.01) |

(52) U.S. Cl.
CPC .......... *G06F 11/2094* (2013.01); *G11C 16/10* (2013.01); *G11C 16/16* (2013.01); *G11C 16/3459* (2013.01); *G06F 2201/805* (2013.01); *G06F 2201/82* (2013.01); *G06F 2201/85* (2013.01); *G11C 16/26* (2013.01); *G11C 2216/14* (2013.01)

(58) Field of Classification Search
CPC .............................. G06F 11/20; G06F 11/2094
USPC ...................................................... 714/6.13
See application file for complete search history.

(56) References Cited

U.S. PATENT DOCUMENTS

| | | |
|---|---|---|
| 8,176,284 B2 | 5/2012 | Frost et al. |
| 8,379,454 B2 | 2/2013 | Kochar et al. |
| 8,478,796 B2 | 7/2013 | Post et al. |
| 8,645,776 B2 | 2/2014 | Byom et al. |
| 8,730,722 B2 | 5/2014 | Koh et al. |
| 8,892,981 B2 | 11/2014 | Post et al. |
| 9,021,339 B2 | 4/2015 | Lu et al. |
| 9,058,261 B1 | 6/2015 | Jean et al. |
| 9,092,363 B2 | 7/2015 | Avila et al. |
| 9,105,349 B2 | 8/2015 | Avila et al. |
| 9,128,822 B2 | 9/2015 | Michael et al. |
| 9,135,112 B2 | 9/2015 | Chen et al. |
| 9,229,854 B1 * | 1/2016 | Kuzmin .................. G06F 8/654 |
| 9,305,663 B2 | 4/2016 | Silberman et al. |
| 9,355,713 B2 | 5/2016 | Huang et al. |
| 9,595,343 B1 * | 3/2017 | Srinivasan ......... G11C 16/3459 |

(Continued)

*Primary Examiner* — Kamini B Patel
(74) *Attorney, Agent, or Firm* — Kligler & Associates

(57) ABSTRACT

An apparatus includes an interface and storage circuitry. The interface is configured to communicate with a memory that includes multiple memory cells arranged in multiple planes that each includes one or more blocks of the memory cells. The storage circuitry is configured to apply a multi-plane storage operation to multiple blocks simultaneously across the respective planes. In response to detecting that the multi-plane storage operation has failed, the storage circuitry is configured to apply a single-plane storage operation to one or more of the blocks that were accessed in the multi-plane storage operation, including a given block, and to identify the given block as a bad block if the single-plane operation applied to the given block fails. The storage circuitry is further configured to store data in the blocks that were accessed in the multi-plane operation but were not identified as bad blocks.

16 Claims, 3 Drawing Sheets

(56) References Cited

U.S. PATENT DOCUMENTS

| | | | |
|---|---|---|---|
| 2009/0157964 A1* | 6/2009 | Kasorla | G06F 12/0246 |
| | | | 711/118 |
| 2012/0254519 A1* | 10/2012 | Ellis | G06F 12/0246 |
| | | | 711/103 |
| 2013/0294168 A1 | 11/2013 | Shirakawa | |
| 2014/0157078 A1 | 6/2014 | Danilak et al. | |
| 2014/0157087 A1* | 6/2014 | Yurzola | G06F 11/1068 |
| | | | 714/773 |
| 2014/0189421 A1 | 7/2014 | Werner et al. | |
| 2014/0281813 A1* | 9/2014 | Wakchaure | G06F 11/108 |
| | | | 714/766 |
| 2015/0317210 A1* | 11/2015 | Palmer | G06F 11/1441 |
| | | | 714/6.3 |
| 2016/0034353 A1 | 2/2016 | Tuers et al. | |
| 2017/0221569 A1* | 8/2017 | Akamine | G11C 16/26 |
| 2017/0293527 A1* | 10/2017 | Shappir | G06F 11/108 |

\* cited by examiner

IDENTIFYING A FAILING GROUP OF MEMORY CELLS IN A MULTI-PLANE STORAGE OPERATION

TECHNICAL FIELD

Embodiments described herein relate generally to data storage, and particularly to methods and systems for identifying a group of memory cells that fails in a multi-plane storage operation.

BACKGROUND

Memory cells in a nonvolatile memory (NVM) device may malfunction due to various impairments. Some memory devices keep track of and avoid using non-functional memory cells. Methods for managing failing memory cells are known in the art. For example, U.S. Pat. No. 9,058,261, whose disclosure is incorporated herein by reference, describes embodiments that are directed to providing detailed error reporting of data operations performed on a NVM storage device. In one embodiment, a controller interfaces with a NVM storage device including NVM storage coupled with a bridge. In one embodiment, the controller is provided physical, page-level access to the NVM via the bridge, and the bridge provides detailed error reporting of the data operations that the bridge performs on the NVM on behalf of the controller. For example, the bridge may provide page level reporting indicating which page(s) failed during a read operation. Detailed error reporting allows the controller to better understand the failures that occurred in a data access operation in the NVM.

U.S. Pat. No. 9,305,663, whose disclosure is incorporated herein by reference, describes examples of assessing pass/fail status of a non-volatile memory. In some examples, information may be received to indicate a block having memory pages associated with non-volatile memory cells. The information may indicate at least some of the memory pages have bit errors in excess of an error correction code (ECC) ability to correct. For these examples, the block may be selected for read testing. Read testing may include programming the memory pages with a known pattern and waiting a period of time. Following the period of time each memory page may be read and if a resulting pattern read matches the known pattern programmed to each memory page, the memory page passes. The block may be taken offline if the number of passing memory pages is below a pass threshold number.

SUMMARY

An embodiment that is described herein provides an apparatus that includes an interface and storage circuitry. The interface is configured to communicate with a memory that includes multiple memory cells arranged in multiple planes that each includes one or more blocks of the memory cells. The storage circuitry is configured to apply a multi-plane storage operation to multiple blocks simultaneously across the respective planes. In response to detecting that the multi-plane storage operation has failed, the storage circuitry is configured to apply a single-plane storage operation to one or more of the blocks that were accessed in the multi-plane storage operation, including a given block, and to identify the given block as a bad block if the single-plane operation applied to the given block fails. The storage circuitry is further configured to store data in the blocks that were accessed in the multi-plane operation but were not identified as bad blocks.

In some embodiments, the storage circuitry is configured to detect that the multi-plane storage operation has failed by receiving an indication, which specifies that the multi-plane storage operation has failed as a whole, but does not specify any particular block in which the multi-plane storage operation has failed. In other embodiments, the storage circuitry is configured to apply the multi-plane storage operation by programming respective data pages, each individually encoded using an Error Correcting Code (ECC), in multiple blocks that belong to different respective planes, to apply the single-plane storage operation by retrieving a data page from the given block and decoding the retrieved data page using the ECC, and to identify the given block as a bad block when decoding the retrieved data page fails. In yet other embodiments, the storage circuitry is configured to apply the multi-plane storage operation by programming data pages in multiple blocks that each belongs to a different respective plane, to apply the single-plane storage operation by erasing the given block, and programming data pages to one or more word lines (WLs) of the given block using single-plane programming operations, and if the programming of at least one of the WLs has failed, to identify the given block as a bad block.

In an embodiment, the storage circuitry is configured to apply the multi-plane storage operation by erasing simultaneously multiple blocks that each belongs to a different respective plane, to apply the single-plane storage operation by erasing the given block using a single-plane erasure operation, and if the single-plane erasure operation fails, to identify the given block as a bad block. In another embodiment, the memory device includes a three-dimensional (3D) memory device in which each of the blocks includes multiple sections that share common word lines (WLs) and that can be accessed for storage individually, and the storage circuitry is configured to apply the single-plane storage operation by erasing the given block using a single-plane erasure operation, and in response to detecting that erasing the given block has failed, to identify a selected section of the given block as a bad section.

In some embodiments, the storage circuitry is configured to identify the selected section as a bad section by reading the memory cells of the selected section using a reading threshold that separates between an erasure programming level and one or more other programming levels of the memory device, and determining that a number of memory cells falling above the reading threshold exceeds a predefined threshold number. In other embodiments, the storage circuitry is configured to identify the selected section as a bad section by programming one or more data pages that were each encoded using an ECC to respective WLs of the selected section, retrieving the encoded data and decoding the ECC of the data pages, and determining that a number of WLs in the selected section for which the decoding has failed exceeds a predefined threshold number.

There is additionally provided, in accordance with an embodiment that is described herein, a method, including, in a memory device that includes multiple memory cells that are arranged in multiple planes, and each plane includes one or more blocks of the memory cells, applying a multi-plane storage operation to multiple blocks simultaneously across the respective planes. In response to detecting that the multi-plane storage operation has failed, a single-plane storage operation is applied to one or more of the blocks that were accessed in the multi-plane storage operation, including a given block, and if the single-plane operation applied to the given block fails, the given block is identified as a bad block. Data is stored in the blocks that were accessed in the multi-plane operation but were not identified as bad blocks.

These and other embodiments will be more fully understood from the following detailed description of the embodiments thereof, taken together with the drawings in which:

DETAILED DESCRIPTION OF EMBODIMENTS

Overview

Figure 1:
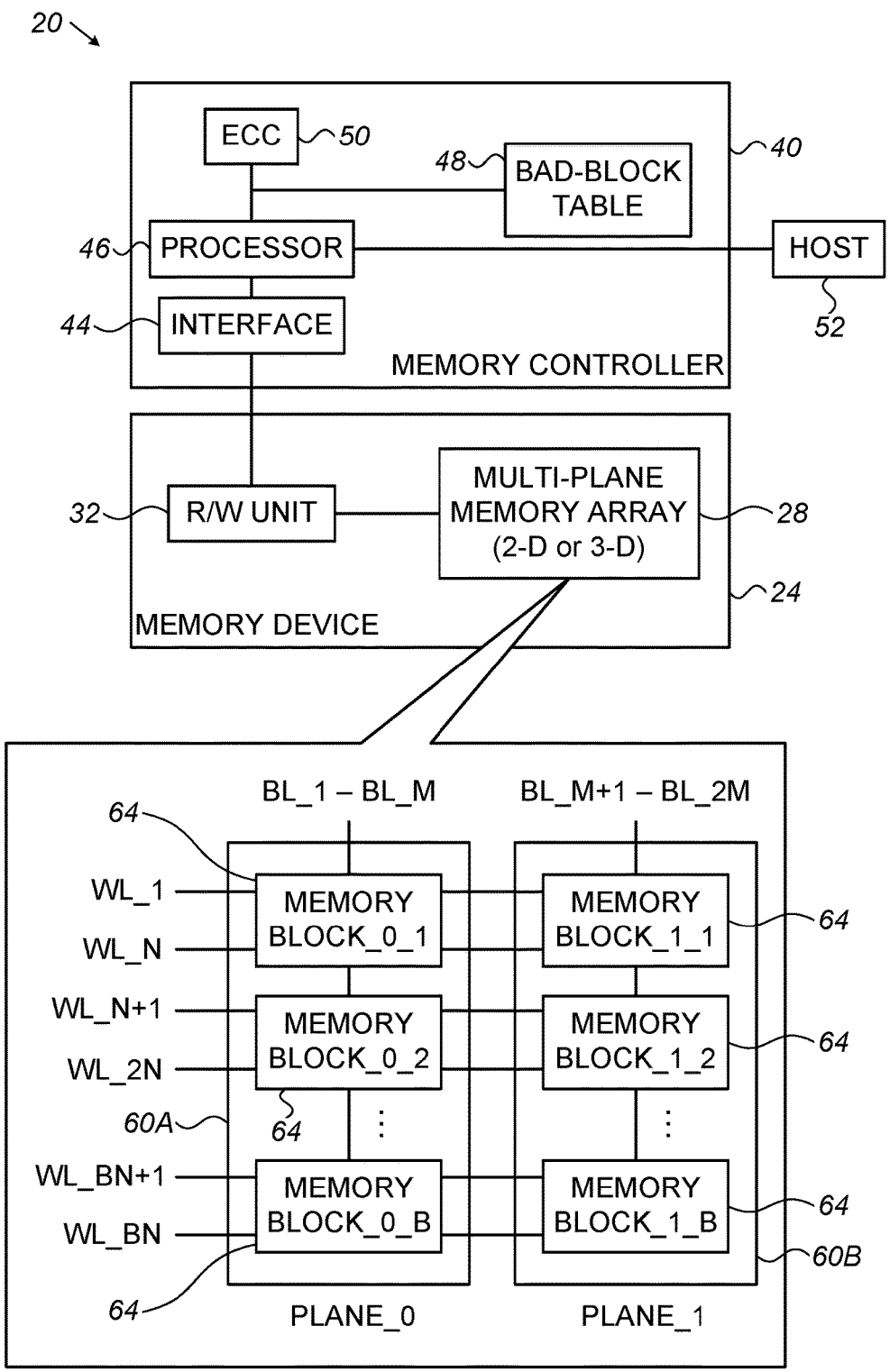
FIG. 1 is a block diagram that schematically illustrates a memory system in which groups of memory cells failing in multi-plane storage operations are identified, in accordance with an embodiment that is described herein.

Memory cells in some types of memory devices are arranged in multiple planes that each comprises multiple blocks of the memory cells. Such a memory device typically supports both single-plane and multi-plane storage operations. In the single-plane mode, only one block at a time is accessible in a selected plane. In contrast, the multi-plane mode supports accessing multiple blocks belonging to multiple respective planes simultaneously, therefore increasing the storage throughput.

Erasing memory cells is typically carried out in units of entire blocks. In a multi-plane erasure operation, the memory device erases multiple blocks across multiple respective planes simultaneously. Programming data is typically carried out by programming a data page to a group of memory cells that are connected to a given word line (WL). In multi-plane programming, the memory device programs in parallel multiple such groups of the memory cells, which are connected to a common WL across the respective planes.

Some of the memory cells may be defective at production, or become unusable during the lifetime of the memory device due to various impairments. For example, a memory cell may fail to reach a desired programming or erasure level after being applied a maximal number of programming or erasure pulses, respectively.

The memory device is typically controlled by a memory controller, which manages a storage pool of the memory cells, by excluding malfunctioning memory cells from the pool. For the cell exclusion to be manageable, the controller may exclude the memory cells in sufficiently large groups such as one or more full blocks.

Embodiments that are described herein provide improved methods and system for identifying groups of memory cells to be excluded from the storage pool, when a multi-plane storage operation fails.

In some embodiments, the memory device reports to the controller of a failing multi-plane storage operation without specifying any particular failing block. In the disclosed embodiments, the controller further tests individual blocks that were accessed in the failing multi-plane storage operation and retires only individual blocks that have actually failed.

In the context of the present patent application and in the claims, a block of memory cells that is identified as non-functional and retired is referred to as a "bad block." Note that a bad block may contain memory cells that are functional but nevertheless retired with the entire block.

In some embodiments, in response to detecting that a multi-plane storage operation has failed, the device applies a single-plane storage operation to one or more of the blocks that were accessed in the multi-plane storage operation, including a given block, and identifies each of these blocks as a bad block if the respective single-plane operation applied individually to the block fails. The device then uses for storage the blocks that were accessed in the multi-plane operation but were not identified as bad blocks.

In some embodiments, the multi-plane storage operation comprises a multi-plane programming operation, and each of the data pages programmed to blocks in the respective planes is encoded using an Error Correcting Code (ECC). To apply the single-plane storage operation, the controller retrieves a data page that was programmed encoded to the given block in the multi-plane storage operation, decodes the retrieved data page using the ECC, and identifies the given block as a bad block when the decoding fails.

In other embodiments, the data pages in the multi-plane programming operation are not necessarily encoded, and the controller applies the single-plane storage operation by erasing the given block, programming data to one or more WLs of the given block using single-plane programming operations, and identifies the given block as a bad block if the programming of at least one of the WLs in the given block has failed.

In some embodiments, the memory device comprises a three-dimensional (3D) device in which each of the blocks comprises multiple sections that are accessible individually. In such embodiments, excluding a full 3D block from the storage pool may be inefficient, especially if only one of the sections actually fails. In an embodiment, when a single-plane erasure operation applied to a 3D block fails, the controller tests the sections of the block separately, and if a selected section of the given block fails the test, the controller identifies this section as a bad section.

In the disclosed techniques, even though a multi-plane programming or erasure operation fails as a unit operation, the blocks accessed in the multi-plane operation are classified using single-plane operations. As a result, only blocks that are actually non-functional are retired. In 3D devices, sub-blocks such as sections of the 3D blocks are retired individually. The disclosed techniques result in efficient management of the pool of memory cells available for storage.

System Description

FIG. 1 is a block diagram that schematically illustrates a memory system 20 in which groups of memory cells failing in multi-plane storage operations are identified, in accordance with an embodiment that is described herein. System 20 can be used in various host systems and devices, such as in computing devices, cellular phones or other communication terminals, removable memory modules, Solid State Disks (SSD), digital cameras, music and other media players and/or any other system or device in which data is stored and retrieved.

System 20 comprises a memory device 24, which stores data in a memory cell array 28. The memory array comprises multiple memory cells (not shown), such as analog memory cells. In the context of the present patent application, the term "analog memory cell" is used to describe any memory cell that holds a continuous, analog value of a physical parameter, such as an electrical voltage or charge. Array 28 may comprise solid-state analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

System 20 stores data in the memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

In an example configuration of array 28, the memory cells are arranged in multiple rows and columns, and each memory cell comprises a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device.

Memory device 24 comprises a reading/writing (R/W) unit 32, which converts data for storage in the memory device to analog storage values and writes them into the memory cells. In alternative embodiments, the R/W unit does not perform the conversion, but is provided with voltage samples, i.e., with the storage values for storage in the cells. When reading data out of array 28, R/W unit 32 converts the storage values of the memory cells into digital samples having an integer resolution of one or more bits. Data is typically written to groups of memory cells and read from the groups of the memory cells in data units that are referred to as data pages, or simply pages, for brevity.

In some embodiments, a page is programmed to an entire row (word line) of the array. In alternative embodiments, each row can be divided to store two or more pages. For example, in some devices each row is divided into two pages, one comprising the odd-order cells and the other comprising the even-order cells. In some embodiments, memory pages are sub-divided into sectors.

In some embodiments, the memory cells are arranged in multiple memory arrays, also referred to as planes, and it is possible to program data into multiple respective planes in parallel. In the context of the present disclosure, a write operation in which data is programmed to multiple planes in parallel is referred to herein as a multi-plane programming operation, whereas a write operation that programs each plane separately is referred to as a single-plane programming operation.

In some embodiments, the R/W unit can erase a group of memory cells by applying one or more negative erasure pulses to the cells. In a single-plane erasure operation the R/W unit erases the memory cells in units that are referred to as "erasure blocks" that each comprises multiple pages. R/W unit additionally supports a multi-plane erasure operation that erases multiple erasure blocks in multiple respective planes in parallel. An "erasure block" is also referred to simply as "block" for brevity.

In some embodiments, when programming or erasing a plurality of memory cells, the R/W unit sets the memory cells to respective target analog values, by applying to the memory cells a sequence of program-and-verify (P&V) or erase-and-verify (E&V) iterations. In each such iteration the R/W unit attempts to set the memory cells to assume the target analog values, by applying to the memory cells a programming (or erasure) pulse, and then verifies whether the target analog values have been reached in accordance with a verification condition.

For example, in some embodiments, the R/W unit may count the number of memory cells that have not reached a predefined verification threshold, and require that the counted number is smaller than a predefined permitted count for the operation to be considered successful. After applying a predefined number of iterations without meeting the verification condition, the R/W unit may recognize a programming (or erasure) failure.

In multi-plane programming, a programming pulse is applied to the memory cells being programmed in multiple respective planes simultaneously. In this case, the R/W unit reports a multi-plane programming failure, i.e., with no reference to any particular block or plane in which the programming has failed. Similarly, in a multi-plane erasure operation, an erasure pulse is applied simultaneously to the memory cells being erased in multiple planes. The R/W unit reports a multi-plane erasure failure with no reference to any particular block or plane in which the erasure has failed.

The lower part of FIG. 1 depicts an example internal structure of array 28 comprising two planes 60A and 60B denoted PLANE_0 and PLANE_1, respectively. In alternative embodiments, array 28 may comprises any number of planes 60 larger than two. Each of planes 60 comprises multiple erasure blocks 64 of the memory cells. In the present example, the number of blocks per plane is denoted "B". Each block in the figure is identified using two digits representing the plane number 0 or 1, and the block index within the plane ranging between 1 and B.

In some embodiments, memory device 24 comprises a two-dimensional (2D) device, in which the memory cells in blocks 64 are arranged in a 2D configuration, so that N cell-rows are connected to respective N word lines (WLs), and M cell-columns are connected to respective M bit lines (BLs). In some embodiments, blocks belonging to the same plane share the same group of bit lines, whereas blocks belonging to different planes and have the same block index share the same group of WLs.

In applying multi-plane programming, the R/W unit writes multiple pages in parallel to cell-rows of the same WL in multiple respective planes. In multi-plane erasure, the R/W unit erasures, in parallel, multiple blocks 64 having the same block index in multiple respective planes.

In other embodiments, memory device 24 comprises a three-dimensional (3D) device, in which the memory cells in blocks 64 are arranged in a 3D configuration. In such embodiments, each block 64 is a 3D block comprises multiple sections (e.g., four sections per block) that R/W unit can select individually for applying a storage operation. In each such 3D block, cell-rows in different sections that have the same row index are connected to a common WL, and cell-columns in different sections that have the same column index connect to a common BL.

The storage and retrieval of data in and out of memory device 24 is performed by a memory controller 40. Memory controller 40 comprises an interface 44 for communicating with memory device 24, a processor 46, and an Error Correcting Code (ECC) unit 50. The disclosed techniques can be carried out by memory controller 40, by R/W unit 32, or both. Thus, in the present context, memory controller 40 and R/W unit 32 are referred to collectively as storage circuitry that carries out the disclosed techniques.

Memory controller 40 communicates with a host 52, for accepting data for storage in the memory device and for outputting data retrieved from the memory device. ECC unit 50 encodes the data for storage using a suitable ECC and decodes the ECC of data retrieved from the memory. Any suitable type of ECC, such as, for example, Low Density Parity Check (LDPC), Reed-Solomon (RS) or Bose-Chaudhuri-Hocquenghem (BCH), can be used. By using the ECC, a programming operation may be considered successful when the number of memory cells failing to reach their target level is within the error correction capabilities of the ECC. Decoding the ECC of an encoded page read from the memory, in which the number erroneous bits is beyond the ECC capability results in a decoding failure. Such an event is also referred to as an unrecoverable ECC event, or a "UECC" event.

Memory controller 40 receives from the R/W unit, via interface 44, reports groups of the memory cells that failed during single-plane as well as multi-plane programming and erasure operations. The memory controller stores identities (e.g., addressing information) of the reported blocks in a table 48 of "bad blocks" so as to refrain from using them in subsequent storage operations. Alternatively or additionally, the failing groups of memory cells are reported at sub-block granularity, e.g., in units of a section of the memory cells in a 3D device.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a RAID storage system. Elements that are not necessary for understanding the principles of the present disclosure, such as various interfaces, addressing circuits, timing and sequencing circuits and debugging circuits, have been omitted from the figure for clarity.

In the example system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Identifying Bad Blocks in Applying Multi-plane Storage Operations

Retiring all of the blocks that were accessed in a failing multi-plane storage operation may be inefficient, because typically a small subset or even only one of these blocks may have actually failed. In the disclosed embodiments, when a multi-plane programming or erasure operation fails, the involved blocks are tested separately using single-plane storage operations, and only blocks that fail the respective single-plane operations are classified as bad blocks and retired.

Figure 2:
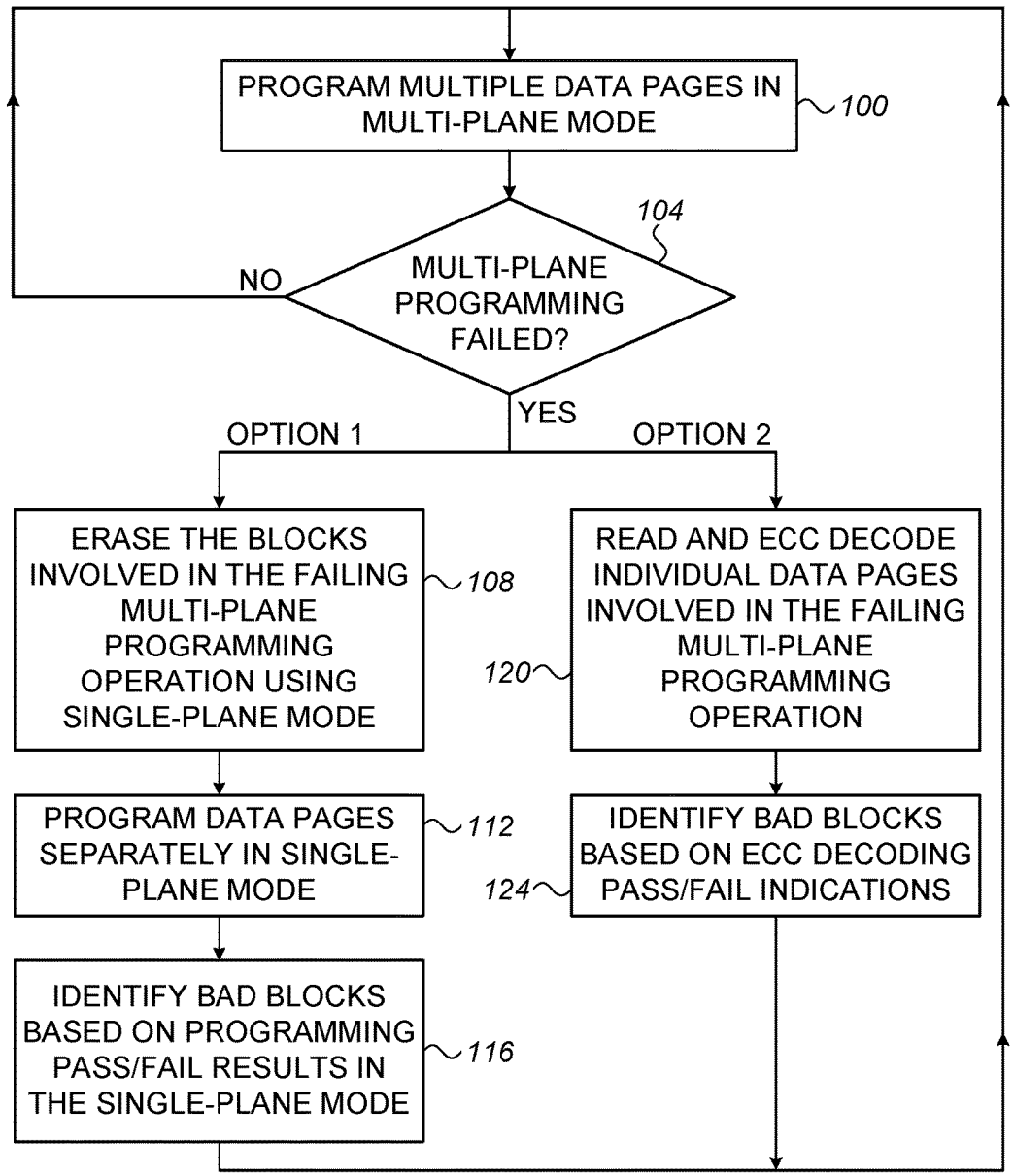
FIG. 2 is a flow chart that schematically illustrates a method for identifying individual bad blocks in applying a multi-plane programming operation, in accordance with an embodiment that is described herein.

FIG. 2 is a flow chart that schematically illustrates a method for identifying individual bad blocks in applying a multi-plane programming operation, in accordance with an embodiment that is described herein. The method can be executed, for example, by processor 46 of the memory controller in memory system 20.

At a multi-plane programming step 100, processor 46 sends to memory device 24, via interface 44, a command for storing multiple data pages in multiple respective planes simultaneously using a multi-plane programming operation. The data pages to be stored may originate, for example, from host 52 or processor 46. In response to receiving the command, memory device 24 performs the multi-plane programming operation received, and reports back to the processor a multi-plane pass/fail indication. In case of a failure, the indication does not specify individual blocks that have failed to be programmed.

At a multi-plane indication checking step 104, the processor checks the pass/fail indication reported at step 100. If at step 104 the multi-plane operation has succeeded, i.e., all the data pages in the multi-plane operation were written successfully, the processor loops back to step 100 to perform subsequent multi-plane programming commands. Otherwise, the programming in at least one of the planes of the multi-plane operation is expected to have failed, and the processor proceeds in one of two optional flows denoted OPTION 1 and OPTION2. Flow OPTION1 includes steps 108, 112 and 116, whereas flow OPTION2 includes steps 120 and 124.

In OPTION1, at a single-plane erasure step 108, the processor erases one or more of the blocks that were accessed in the multi-plane programming operation of step 100 using a single-plane erasure operation. In an embodiment, prior to the erasure, the processor backs up the data pages that the memory device received in the multi-plane programming command, to other blocks of the memory device, or to a memory of the controller or the host (not shown.)

At a single-plane programming step 112, the processor programs individual data pages to one or more of the blocks that were accessed in the multi-plane programming operation, using single-plane programming operations. In some embodiments, in programming data to a block in given plane in the single-plane mode, the processor programs the same data page content, to the same WL, as was programmed in the failing multi-plane operation. Alternatively, in the single-plane mode, the processor uses (e.g., predefined) testing data, and/or a WL different from the WL used in the multi-plane programming operation. In addition, the testing data may vary among different WLs.

For each of the single-plane operations, the memory device reports to the processor a single-plane pass/fail indication. Note that a block failing the multi-plane programming operation is also expected to fail the single-plane programming operation, but this is not mandatory, as will be explained herein.

Note that typically, when a multi-plane programming operation fails, at least one of the involved blocks is expected to fail the single-plane programming operation. In some situations, however, even though the multi-plane operation has failed, all the single-plane operations applied the relevant blocks complete successfully, and none of these blocks is retired. In some embodiments, the host keeps track of such blocks that are involved in a failing multi-plane programming operation but all pass the respective single-plane programming operations, and after a predefined number of such occurrences, the host retires these blocks.

At an OPTION1 block-identification step 116, the processor identifies, based on the individual single-plane pass/fail indications, one or more respective bad blocks among the blocks to which the single-plane operation was applied. Alternatively, all the blocks accessed in the multi-plane operation have passed the respective single-plane operations, as described above. In some embodiments, the processor stores the identities of the blocks identified as bad blocks in table 48, and uses for subsequent storage operations only blocks that were not identified as bad blocks at step 116.

In performing OPTION2 flow, it is assumed that the data pages programmed at step 100 were each encoded using ECC 50 before written to the memory. At a read and decode step 120, the processor reads one or more of the data pages programmed in the multi-plane programming operation of step 100, using single-plane read operations in the respective planes. Alternatively, the processor may read the data pages using a multi-plane read operation, and if this multi-plane operation fails, the processor attempts using single-plane read operations. The processor decodes each of the data pages read using ECC 50.

At an OPTION2 block-identification step 124, the processor identifies, based on the decoding pass/fail indications of the individual data pages, one or more bad blocks among the blocks involved in the failing multi-plane programming operation. For example, a block may be identified as a bad block when the number of pages whose decoding has failed exceeds a predefined threshold number. Alternatively, all the blocks that were accessed in the multi-plane operation complete the respective single-plane operations successfully, as described above. Following step 124 the processor loops back to step 100 to perform subsequent multi-plane programming operations.

Figure 3:
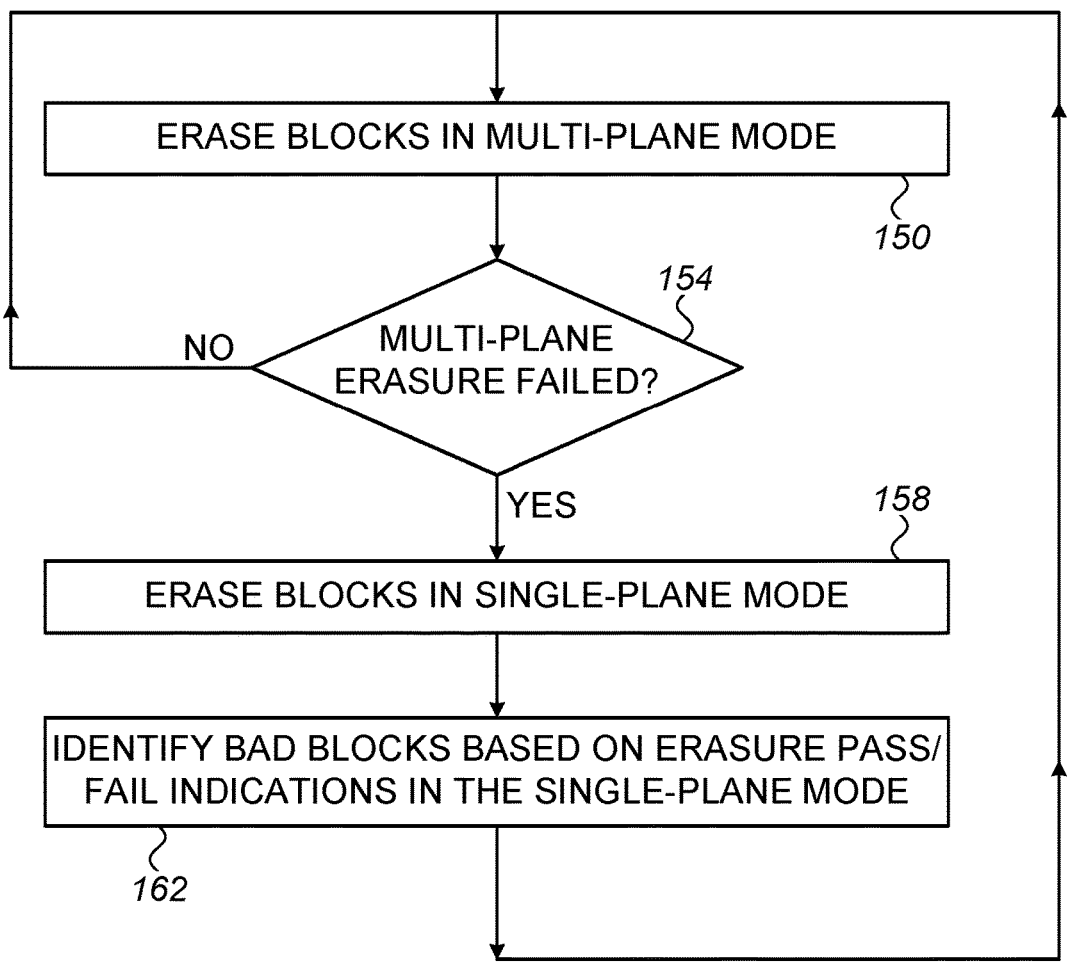
FIG. 3 is a flow chart that schematically illustrates a method for identifying individual bad blocks in applying a multi-plane erasure operation, in accordance with an embodiment that is described herein.

FIG. 3 is a flow chart that schematically illustrates a method for identifying individual bad blocks in applying a multi-plane erasure operation, in accordance with an embodiment that is described herein. The method may be executed by processor 46 of the memory controller in system 20.

The method begins with processor 46 sending to memory device a multi-plane erasure command for erasing multiple blocks in respective planes simultaneously. In response to receiving the multi-plane erasure command, the memory device erases the relevant blocks, and reports back to the processor, e.g., via interface 44, a multi-plane erasure pass/fail indication. When indicating a failure, the indication does not specify individual blocks that have failed to be erased.

At a multi-plane indication checking step 154, the processor checks the pass/fail indication reported at step 150. If at step 154 the multi-plane operation has succeeded, i.e., all the blocks in the multi-plane operation were erased successfully, the processor loops back to step 150 to perform subsequent multi-plane erasure commands. Otherwise, the block erasure in at least one of the planes has failed, and the processor proceeds to a single-plane erasure step 158.

At step 158 the processor individually erases one or more of the blocks that were accessed in the multi-plane erasure operation of step 150 using single-plane erasure operations. For each of the single-plane operations, the memory device reports to the processor a single-plane pass/fail indication. Note that a block failing the multi-plane erasure operation is also expected to fail the single-plane erasure operation. As described above, however, it is possible that even though a multi-plane operation fails, all the relevant blocks pass the respective single-plane operations, and are therefore not retired. In addition, the host tracks such blocks, and retire these blocks if this event occurs above a predefined number of times.

At a bad block identification step 162, the processor identifies, based on the individual single-plane pass/fail indications, one or more respective bad blocks among the blocks to which the single-plane operation was applied. In some embodiments, the processor stores the identities of the identified bad blocks in table 48, as described above.

Following step 162 the processor loops back to step 150 to issue subsequent multi-plane erasure commands.

Identifying Failing Sub-blocks In 3d Devices

The methods described in FIGS. 2 and 3 above are applicable to both 2D and 3D devices. The storage efficiency when applied to 3D devices, however, is much lower, because a full 3D block is retired even when only a small subgroup of the memory cells in the 3D block actually fails. For example, in a 3D block comprising multiple sections, only a single section may actually fail, e.g., when the transistor selecting this section malfunctions.

In some embodiments, when a single-plane erasure operation to a 3D block of a 3D device fails, processor 46 tests individual sections of the failing 3D block, and retires only sections that fail the test. The testing of individual sections may be initiated, for example, when the erasure of a 3D block using a single-plane erasure operation fails at step 108 of FIG. 2 or at step 158 of FIG. 3.

In some embodiments, to test a given section of the failing 3D block, the processor reads data from the memory cells of the given section by setting a reading threshold that separates between the erasure programming level and the other programming levels. In an example embodiment, if after erasure the number of memory cells in the given section that fall above the reading threshold exceeds a predefined threshold number, the processor identifies the given section as a bad section, and excludes this section from the storage pool.

In other embodiments, the processor programs one or more data pages that each is encoded using ECC 50 to one or more respective WLs of the given section. The data pages prior to the encoding may hold predefined testing data. The processor retrieves the programmed data pages, checks for each data page whether the ECC decoding passes or fails, and identifies the tested section as a bad section based on the pass/fail decoding results. For example, the processor identifies a section as a bad section when the number of WLs for which the ECC decoding has failed exceeds a predefined threshold number.

The embodiments described above are given by way of example, and alternative suitable embodiments can also be used. For example, although in the embodiments described above, the size of the blocks identified as bad blocks is independent of the underlying multi-plane storage operation, in alternative embodiments, the blocks identified and retired in failing multi-plane programming operations may have a different size than the blocks retired in failing multi-plane erasure operations. Moreover, bad blocks identified as bad blocks in different planes may have different respective sizes.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
   an interface, configured to communicate with a memory comprising multiple memory cells arranged in multiple planes, wherein each plane comprises one or more blocks of the memory cells; and
   storage circuitry, which is configured to: apply a multi-plane storage operation to multiple blocks simultaneously across the respective planes;
   apply a single-plane storage operation, in response to detecting that the multi-plane storage operation has failed, to one or more of the blocks that were accessed in the multi-plane storage operation, including a given block, and if the single-plane operation applied to the given block fails, identify the given block as a bad block; and
   for subsequent write operations, retire the given block that was accessed in the multi-plane operation and was identified as a bad block, but permit storage of data in the blocks that were accessed in the multi-plane operation but were not identified as bad blocks.

2. The apparatus according to claim 1, wherein the storage circuitry is configured to detect that the multi-plane storage operation has failed by receiving an indication, which specifies that the multi-plane storage operation has failed as a whole, but does not specify any particular block in which the multi-plane storage operation has failed.

3. The apparatus according to claim 1, wherein the storage circuitry is configured to apply the multi-plane storage operation by programming respective data pages, each individually encoded using an Error Correcting Code (ECC), in multiple blocks that belong to different respective planes, to apply the single-plane storage operation by retrieving a data page from the given block, and decoding the retrieved data page using the ECC, and to identify the given block as a bad block when decoding the retrieved data page fails.

4. The apparatus according to claim 1, wherein the storage circuitry is configured to apply the multi-plane storage operation by programming data pages in multiple blocks that each belongs to a different respective plane, to apply the single-plane storage operation by erasing the given block, and programming data pages to one or more word lines (WLs) of the given block using single-plane programming operations, and if the programming of at least one of the WLs has failed, to identify the given block as a bad block.

5. The apparatus according to claim 1, wherein the storage circuitry is configured to apply the multi-plane storage operation by erasing simultaneously multiple blocks that each belongs to a different respective plane, to apply the single-plane storage operation by erasing the given block using a single-plane erasure operation, and if the single-plane erasure operation fails, to identify the given block as a bad block.

6. The apparatus according to claim 1, wherein the memory device comprises a three-dimensional (3D) memory device in which each of the blocks comprises multiple sections that share common word lines (WLs) and that can be accessed for storage individually, wherein the storage circuitry is configured to apply the single-plane storage operation by erasing the given block using a single-plane erasure operation, and in response to detecting that erasing the given block has failed, to identify a selected section of the given block as a bad section.

7. The apparatus according to claim 6, wherein the storage circuitry is configured to identify the selected section as a bad section by reading the memory cells of the selected section using a reading threshold that separates between an erasure programming level and one or more other programming levels of the memory device, and determining that a number of memory cells falling above the reading threshold exceeds a predefined threshold number.

8. The apparatus according to claim 6, wherein the storage circuitry is configured to identify the selected section as a bad section by programming one or more data pages that were each encoded using an ECC to respective WLs of the selected section, retrieving the encoded data and decoding the ECC of the data pages, and determining that a number of WLs in the selected section for which the decoding has failed exceeds a predefined threshold number.

9. A method, comprising:
   in a memory device comprising multiple memory cells that are arranged in multiple planes, wherein each plane comprises one or more blocks of the memory cells, applying a multi-plane storage operation to multiple blocks simultaneously across the respective planes;
   in response to detecting that the multi-plane storage operation has failed, applying a single-plane storage operation to one or more of the blocks that were accessed in the multi-plane storage operation, including a given block, and if the single-plane operation applied to the given block fails, identifying the given block as a bad block; and
   for subsequent write operations, retiring the given block that was accessed in the multi-plane operation and was identified as a bad block, but permitting storage of data in the blocks that were accessed in the multi-plane operation but were not identified as bad blocks.

10. The method according to claim 9, wherein detecting that the multi-plane storage operation has failed comprises receiving an indication, which specifies that the multi-plane storage operation has failed as a whole, but does not specify any particular block in which the multi-plane storage operation has failed.

11. The method according to claim 9, wherein applying the multi-plane storage operation comprises programming respective data pages, each individually encoded using an Error Correcting Code (ECC), in multiple blocks that belong to different respective planes, and wherein applying the single-plane storage operation comprises retrieving a data page from the given block, decoding the retrieved data page using the ECC, and identifying the given block as a bad block when decoding the retrieved data page fails.

12. The method according to claim 9, wherein applying the multi-plane storage operation comprises programming data pages in multiple blocks that each belongs to a different respective plane, and wherein applying the single-plane storage operation comprises erasing the given block, programming data pages to one or more word lines (WLs) of the given block using single-plane programming operations, and if the programming of at least one of the WLs has failed, identifying the given block as a bad block.

13. The method according to claim 9, wherein applying the multi-plane storage operation comprises erasing simultaneously multiple blocks that each belongs to a different respective plane, and wherein applying the single-plane storage operation comprises erasing the given block using a single-plane erasure operation, and if the single-plane erasure operation fails, identifying the given block as a bad block.

14. The method according to claim 9, wherein the memory device comprises a three-dimensional (3D) memory device in which each of the blocks comprises multiple sections that share common word lines (WLs) and that can be accessed for storage individually, wherein applying the single-plane storage operation comprises erasing the given block using a single-plane erasure operation, and comprising, in response to detecting that erasing the given block has failed, identifying a selected section of the given block as a bad section.

15. The method according to claim 14, wherein identifying the selected section as a bad section comprises reading the memory cells of the selected section using a reading threshold that separates between an erasure programming level and one or more other programming levels of the memory device, and determining that a number of memory cells falling above the reading threshold exceeds a predefined threshold number.

16. The method according to claim 14, wherein identifying the selected section as a bad section comprises programming one or more data pages that were each encoded using an ECC to respective WLs of the selected section, retrieving the encoded data and decoding the ECC of the data pages, and determining that a number of WLs in the selected section for which the decoding has failed exceeds a predefined threshold number.

* * * * *